(12) United States Patent
Parthasarathy et al.

(10) Patent No.: US 11,450,382 B2
(45) Date of Patent: Sep. 20, 2022

(54) MEMORY CELL STATE IN A VALLEY BETWEEN ADJACENT DATA STATES

(71) Applicant: Micron Technology, Inc., Boise, ID (US)

(72) Inventors: Sivagnanam Parthasarathy, Carlsbad, CA (US); Patrick R. Khayat, San Diego, CA (US); Mustafa N. Kaynak, San Diego, CA (US); Robert B. Eisenhuth, Boulder, CO (US)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 17/074,156

(22) Filed: Oct. 19, 2020

(65) Prior Publication Data

US 2021/0035631 A1 Feb. 4, 2021

Related U.S. Application Data

(62) Division of application No. 15/987,414, filed on May 23, 2018, now Pat. No. 10,811,090, which is a
(Continued)

(51) Int. Cl.
*G11C 16/04* (2006.01)
*G11C 11/56* (2006.01)
(Continued)

(52) U.S. Cl.
CPC ...... *G11C 11/5642* (2013.01); *G06F 11/1048* (2013.01); *G06F 11/1068* (2013.01); *G06F 11/1072* (2013.01); *G11C 16/0483* (2013.01); *G11C 16/06* (2013.01); *G11C 16/26* (2013.01); *G11C 16/3418* (2013.01); *G11C 29/52* (2013.01)

(58) Field of Classification Search
CPC ..... G11C 16/3418; G11C 16/26; G11C 16/06; G11C 16/0483
See application file for complete search history.

(56) References Cited

U.S. PATENT DOCUMENTS 7,814,401 B2 10/2010 Alrod et al.
7,904,783 B2 3/2011 Brandman et al.
(Continued)

FOREIGN PATENT DOCUMENTS

CN 101388746 3/2009
CN 101876947 11/2010
(Continued)

OTHER PUBLICATIONS

Dong et al., Reducing Data Transfer Latency of NAND Flash Memory with Soft-Decision Sensing, 2012, IEEE Xplore, 7024-7028 (Year: 2012).*
(Continued)

*Primary Examiner* — Alfredo Bermudez Lozada
(74) *Attorney, Agent, or Firm* — Brooks, Cameron & Huebsch, PLLC

(57) ABSTRACT

A memory cell can have a state in a valley between adjacent data states. A determination can be made whether a state of a memory cell is in a valley between adjacent distributions of states associated with respective data states. A signal indicative of a data state of the memory cell and whether the state of the memory cell is in the valley can be transmitted.

16 Claims, 6 Drawing Sheets

Related U.S. Application Data division of application No. 14/735,312, filed on Jun. 10, 2015, now Pat. No. 9,990,988, which is a division of application No. 13/566,180, filed on Aug. 3, 2012, now Pat. No. 9,064,575.

(51) Int. Cl.

| G11C 16/06 | (2006.01) |
|---|---|
| G11C 16/26 | (2006.01) |
| G11C 16/34 | (2006.01) |
| G06F 11/10 | (2006.01) |
| G11C 29/52 | (2006.01) |

(56) References Cited

U.S. PATENT DOCUMENTS

| 7,966,550 | B2 | 6/2011 | Mokhlesi et al. | |
|---|---|---|---|---|
| 8,499,221 | B2 | 7/2013 | Franceschini et al. | |
| 8,683,303 | B2 | 3/2014 | Blanksby | |
| 8,891,326 | B1 | 11/2014 | Abedifard | |
| 2005/0204271 | A1 | 9/2005 | Sharon et al. | |
| 2008/0082897 | A1* | 4/2008 | Brandman | G06F 11/1072 714/763 |
| 2009/0006399 | A1 | 1/2009 | Raman et al. | |
| 2009/0141558 | A1* | 6/2009 | Sarin | G11C 16/12 365/185.21 |
| 2009/0244973 | A1 | 10/2009 | Scheppler et al. | |
| 2010/0034018 | A1 | 2/2010 | Yang et al. | |
| 2010/0070801 | A1 | 3/2010 | Cornwell et al. | |
| 2010/0077133 | A1 | 3/2010 | Jeon | |
| 2010/0306620 | A1 | 12/2010 | Spraul | |
| 2011/0040924 | A1* | 2/2011 | Selinger | G06F 11/1004 711/E12.008 |
| 2011/0185251 | A1 | 7/2011 | D'Abreu et al. | |
| 2011/0280084 | A1 | 11/2011 | Radke et al. | |
| 2012/0140559 | A1 | 6/2012 | Dong et al. | |
| 2012/0163085 | A1 | 6/2012 | Alrod et al. | |
| 2012/0191923 | A1 | 7/2012 | Pekny | |
| 2014/0208189 | A1 | 7/2014 | Parthasarathy et al. | |

FOREIGN PATENT DOCUMENTS

| JP | 2010123236 | 6/2010 |
|---|---|---|
| JP | 2010262640 | 11/2010 |
| JP | 2014503104 | 2/2014 |
| JP | 2016509420 | 3/2016 |
| WO | 2008042593 | 4/2008 |

OTHER PUBLICATIONS

International Search Report and Written Opinion from related international application No. PCT/US2013/052942, dated Nov. 19, 2013, 13 pp.
Guiqiang, et al., "Reducing data transfer latency of NAND flash memory with soft-decision sensing", 2012 IEEE International Conference on Communications (ICC), Jun. 10, 2012, 6 pp.
Guiqiang, et al., "On the Use of Soft-Decision Error Correction Codes in NAND Flash Memory", IEEE Transactions on Circuits and Systems I: Regular Papers, vol. 58, No. 2, Feb. 1, 2011, 12 pp.
International Search Report and Written Opinion from related international application No. PCT/US2013/052942, dated Jun. 7, 2015, 10 pp.
Notice of Rejection for related Japan Patent Application No. 2015-525546, dated Apr. 12, 2016, 6 pages.
Notice of Rejection for related Korea Patent Application No. 9-5-2016-054503235, dated Jul. 28, 2016, 10 pages.
Office Action for related China Patent Application No. 201380047414. 3, dated Jan. 16, 2017, 13 pages.
Notice of Rejection for related Korea Patent Application No. 10-2015-7005230, dated Feb. 24, 2017, 7 pages.
Communication Pursuant to Article 94(3) EPC for related EP Application No. 13826136.7, dated Oct. 9, 2018, 6 pgs.
Office Action for related China Patent Application No. 201710970307. 8, dated Sep. 17, 2020, 14 pages.
Dong, et al., "Reducing data transfer latency of NAND flash memory with soft-decision sensing", 2012 IEEE International Conference on Communications (ICC), Jun. 10, 2012, 6 pp. (Previously cited incorrectly as "Guiqiang et al").
Dong, et al., "On the Use of Soft-Decision Error Correction Codes in NAND Flash Memory", IEEE Transactions on Circuits and Systems I: Regular Papers, vol. 58, No. 2, Feb. 1, 2011, 12 pp. (Previously cited incorrectly as "Guiqiang et al").

* cited by examiner

455 →

| COMPRESSION TABLE (8 LEVEL SYSTEM) | | |
|---|---|---|
| LEVEL | NEAR VALLEY | ENCODING [msb:lsb] |
| 0 | 0 | [0,0,0,0] |
| 1 | 0 | [0,1,1] |
| 2 | 0 | [0,1,0] |
| 3 | 0 | [1,0,1] |
| 4 | 0 | [1,0,0] |
| 5 | 0 | [1,1,1] |
| 6 | 0 | [1,1,0] |
| 7 | 0 | [0,0,1] |
| 0 | 1 | [0,0,0,1,1,0,1] |
| 1 | 1 | [0,0,0,1,1,0,0] |
| 2 | 1 | [0,0,0,1,1,1,1] |
| 3 | 1 | [0,0,0,1,1,1,0] |
| 4 | 1 | [0,0,0,1,0,0,1] |
| 5 | 1 | [0,0,0,1,0,0,0] |
| 6 | 1 | [0,0,0,1,0,1,1] |
| 7 | 1 | [0,0,0,1,0,1,0] |

MEMORY CELL STATE IN A VALLEY BETWEEN ADJACENT DATA STATES

PRIORITY INFORMATION

This application is a Divisional of U.S. application Ser. No. 15/987,414, filed May 23, 2018, which issues as U.S. Pat. No. 10,811,090, on Oct. 20, 2020, which is a Divisional of U.S. application Ser. No. 14/735,312, filed Jun. 10, 2015, which issued as U.S. Pat. No. 9,990,988 on Jun. 5, 2018, which is a Divisional of U.S. application Ser. No. 13/566,180, filed Aug. 3, 2012, which issued as U.S. Pat. No. 9,064,575 on Jun. 23, 2015, the contents of which are included herein by reference.

TECHNICAL FIELD

The present disclosure relates generally to semiconductor memory and methods, and more particularly, to apparatuses and methods related to a memory cell state in a valley between adjacent data states.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error information, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Flash memory devices can include a charge storage structure, such as is included in floating gate flash devices and charge trap flash (CTF) devices, which may be utilized as non-volatile memory for a wide range of electronic applications. Flash memory devices may use a one-transistor memory cell that allows for high memory densities, high reliability, and low power consumption.

Memory cells in an array architecture can be programmed to a target state. For example, electric charge can be placed on or removed from the floating gate of a memory cell to put the cell into one of a number of data states. For example, a single level cell (SLC) can be programmed to one of two data states representing one of two units of data (e.g., 1 or 0). Multilevel memory cells (MLCs) can be programmed to one of more than two data states. For example, an MLC capable of storing two units of data can be programmed to one of four data states, an MLC capable of storing three units of data can be programmed to one of eight data states, and an MLC capable of storing four units of data can be programmed to one of sixteen data states. MLCs can allow the manufacture of higher density memories without increasing the number of memory cells since each cell can represent more than one unit of data (e.g., more than one bit). However, MLCs can present difficulties with respect to sensing operations as the ability to distinguish between adjacent data states may deteriorate over time and/or operation.

BRIEF DESCRIPTION OF THE DRAWINGS

FIG. 4 illustrates a compression table correlating entropy encoded units of data and data states in accordance with a number of embodiments of the present disclosure.

FIG. 5 illustrates a tabular representation of transmissions of various entropy encoded units of data corresponding to various data states and whether states stored on various memory cells are in a valley and/or within an outer portion of the distribution of states in accordance with a number of embodiments of the present disclosure.

DETAILED DESCRIPTION

Figure 1:
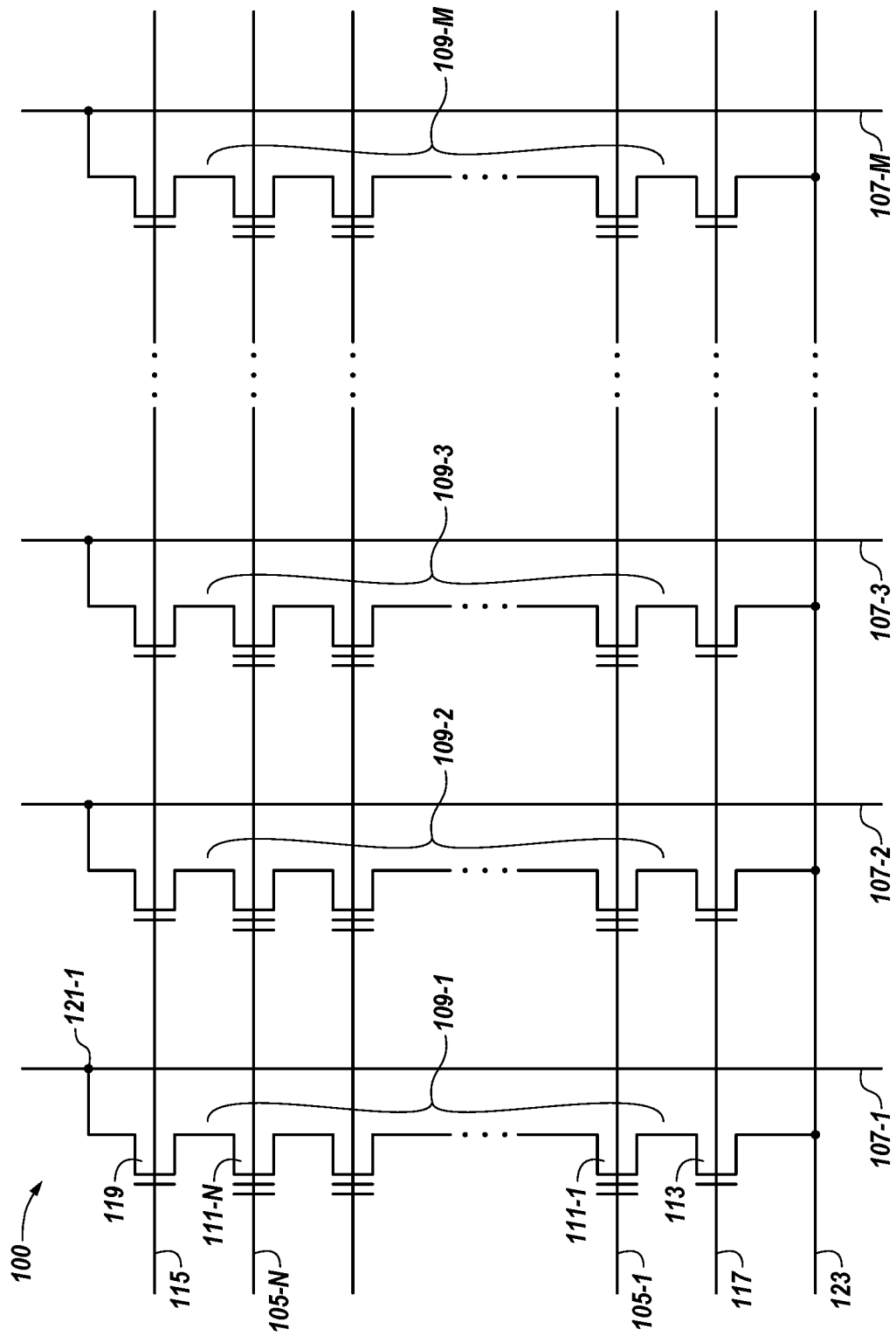
FIG. 1 illustrates a schematic diagram of a portion of a non-volatile memory array in accordance with a number of embodiments of the present disclosure.

Memory devices can include error correction circuitry (e.g., implementing an error correction code (ECC)) to correct for errors in sensing the data state of a memory cell. Some error correction circuitry may operate more effectively with soft data. Hard data is data that corresponds only to the data state of a memory cell. For example, a 2-bit memory cell can be programmed to one of four data states, where each data state corresponds to one of hard data 00, 01, 10, or 11. In contrast, soft data associated with a memory cell can indicate a location of a state (e.g., threshold voltage (Vt)) stored on the memory cell within a distribution of states (e.g., Vt distribution) representing the target state to which the memory cell was programmed. Additionally, soft data associated with a memory cell can indicate a probability of whether the state of the memory cell corresponds to the target state to which the memory cell was programmed. However, transferring soft data along with hard data can decrease bandwidth.

The present disclosure includes apparatuses and methods related to memory cell state in a valley between adjacent data states. A number of methods can include determining whether a state of a memory cell is in a valley between adjacent distributions of states associated with respective data states. The method can include transmitting a signal indicative of a data state of the memory cell and whether the state of the memory cell is in the valley.

Although the examples primarily discussed herein focus on the use of charge storage states as data states and the use of charge stored on a memory cell as a stored state of the memory cell, the present disclosure can also be used with embodiments that use other physical properties of a memory cell to represent data states. For example, other data states could include, but are not limited to, electrical resistance states, optical resistance states, etc.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N", "M", and "P", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 111-1 may reference element "11" in FIG. 1, and a similar element may be referenced as 311 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 illustrates a schematic diagram of a portion of a non-volatile memory array in accordance with a number of embodiments of the present disclosure. The embodiment of FIG. 1 illustrates a NAND architecture non-volatile memory array. However, embodiments described herein are not limited to this example. As shown in FIG. 1, the memory array 100 includes access lines (e.g., word lines 105-1, . . . , 105-N) and intersecting data lines (e.g., local bit lines 107-1, 107-2, 107-3, . . . , 107-M). For ease of addressing in the digital environment, the number of word lines 105-1, . . . , 105-N and the number of local bit lines 107-1, 107-2, 107-3, . . . , 107-M can be some power of two (e.g., 256 word lines by 4,096 bit lines).

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The memory cells 111-1, . . . , 111-N of each NAND string 109-1, 109-2, 109-3, . . . , 109-M are coupled in series source to drain between a source select gate (SGS) (e.g., a field-effect transistor (FET) 113) and a drain select gate (SGD) (e.g., FET 119). Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is coupled to a common source line 123. The drain of source select gate 113 is coupled to the source of the memory cell 111-1 of the corresponding NAND string 109-1. The drain of drain select gate 119 is coupled to bit line 107-1 of the corresponding NAND string 109-1 at drain contact 121-1. The source of drain select gate 119 is coupled to the drain of the last memory cell 111-N (e.g., a floating-gate transistor) of the corresponding NAND string 109-1.

In a number of embodiments, construction of the non-volatile memory cells 111-1, . . . , 111-N includes a source, a drain, a floating gate or other charge storage structure, and a control gate. The memory cells 111-1, . . . , 111-N have their control gates coupled to a word line, 105-1, . . . , 105-N, respectively. A NOR array architecture would be similarly laid out, except that the string of memory cells would be coupled in parallel between the select gates. Furthermore, a NOR architecture can provide for random access (e.g., sensing) to the memory cells in the array (e.g., as opposed to page-based access as with a NAND architecture).

A number (e.g., a subset or all) of cells coupled to a selected word line (e.g., 105-1, . . . , 105-N) can be programmed and/or sensed (e.g., read) together as a group. A number of cells programmed and/or sensed together can correspond to a page of data. In association with a sensing operation, a number of cells coupled to a particular word line and programmed together to respective charge storage states can be referred to as a target page. A programming operation (e.g., a write operation) can include applying a number of program pulses (e.g., 16V-20V) to a selected word line in order to increase the threshold voltage (Vt) of selected cells coupled to that selected access line to a desired program voltage level corresponding to a targeted charge storage state.

A sensing operation, such as a read or program verify operation, can include sensing a voltage and/or current change of a bit line coupled to a selected cell in order to determine the charge storage state of the selected cell. The sensing operation can include precharging a bit line and sensing the discharge when a selected cell begins to conduct. Two different types of sensing operations are described below (e.g., those using a ramping sensing signal versus using a plurality of discrete sensing signals).

Sensing the state of a selected cell can include providing a ramping sensing signal (e.g., −2V to +3V) to a selected word line, while providing a signal (e.g., a pass voltage such as 4.5V) to word lines coupled to the unselected cells of the string sufficient to place the unselected cells in a conducting state independent of the charge stored on the unselected cells. Alternatively, sensing the state of a selected cell could include applying discrete sensing voltages, e.g., −0.05V, 0.5V, and 2V, to a selected word line, and thus to the control gate of a selected cell. The bit line corresponding to the selected cell being read and/or verified can be sensed to determine whether or not the selected cell conducts in response to the particular sensing signal applied to the selected word line. For example, the charge storage state of a selected cell can be determined by the word line voltage at which the bit line current reaches a particular reference current associated with a particular state.

Figure 2:
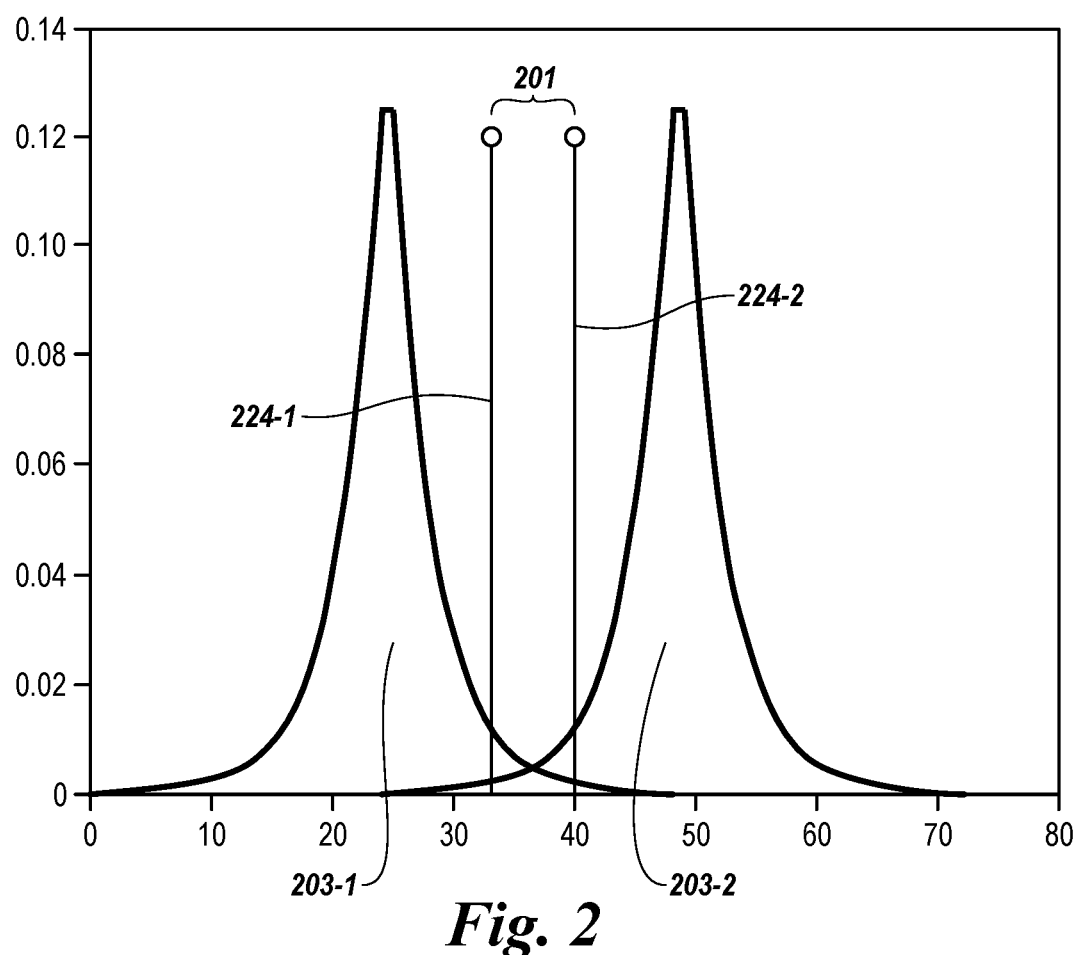
FIG. 2 illustrates a diagram of adjacent distributions of states associated with respective data states and a valley therebetween in accordance with a number of embodiments of the present disclosure.

FIG. 2 illustrates a diagram of adjacent distributions 203-1, 203-2 of states associated with respective data states and a valley 201 therebetween in accordance with a number of embodiments of the present disclosure. The x-axis (with labels from 0-80) represents a unitless magnitude of the state of memory cells. The y-axis (with labels from 0-0.14) represents a percentage of memory cells that are programmed to a particular state. The adjacent distributions of states 203-1, 203-2 represent a statistical distribution of memory cells and their associated states for each of two data states. That is, the first distribution of states 203-1 corresponds to a first data state and the second distribution of states 203-2 corresponds to a second data state.

As is illustrated, each distribution of states 203-1, 203-2 has a peak near its center, for example at a target state for each data state, and trails off on either side of the peak. Between adjacent distributions of states is a valley 201 where states corresponding to different distributions of states 203-1, 203-2 overlap. Thus, without knowing more, a memory cell storing a state between, for example, 33-40 may have had a target state associated with either of the distributions of states 203-1, 203-1. Knowing an exact value of the state of a particular memory cell (e.g., state 224-1 or state 224-2) may aid error correction circuitry in determining which data state was the target for the memory cell. However, as described herein, transferring units of data that provide such a level of detail may create a significant throughput penalty across an interface. Accordingly, a number of embodiments of the present disclosure provide an indication of whether the state is in the valley 201 (e.g., without data indicating a more specific magnitude of the state, such as may be provided by soft data) along with the hard data representing the data state of the memory cell.

As described in more detail herein, such an indication of whether the state of the memory cell is in the valley 201 can be indicated via an entropy coding scheme for those units that are output for the memory cell. For example, a length of an entropy encoded number of units of data can indicate whether the state is in the valley 201 or a particular combination of entropy encoded units of data can indicate whether the state is in the valley 201, among other examples.

In some embodiments, the indication of whether the state of the memory cell is in the valley 201 can comprise an extra unit (e.g., a flag). The extra unit can be transmitted as part of a signal comprising a plurality of units of data corresponding directly to the data state of the memory cell. The plurality of units of data corresponding directly to the data state of the memory cell can comprise hard data.

With respect to one of the distributions of states 203-1, a determination can be made (e.g., by sensing circuitry) as to whether a state 224-1 is within an outer portion of the distribution 203-1 (e.g., at a particular distance from either side of the peak). For example, an outer portion of the distribution 203-1 can include those states outside of two standard deviations from the peak, however embodiments are not so limited. Sensing circuitry can be configured to determine whether a state is within an outer portion of a distribution and to transmit an indication of the same. The indication of whether the state is within an outer portion of the distribution can be analogous to the indication that the state is within the valley 201, as described herein. For example, the indication can be transmitted to entropy coding circuitry. The boundaries of the outer portion can be a programmable option for the sensing circuitry. Examples of the boundaries of the outer portion can include various numbers of standard deviations from the peak, various ranges of magnitudes of states, and various percentages of overlap with an adjacent distribution, among others. With respect to the distribution 203-1 illustrated in FIG. 2, the outer portion on the right side of the peak can, for example, be defined to include those states to the right of the state 224-1.

Figure 3:
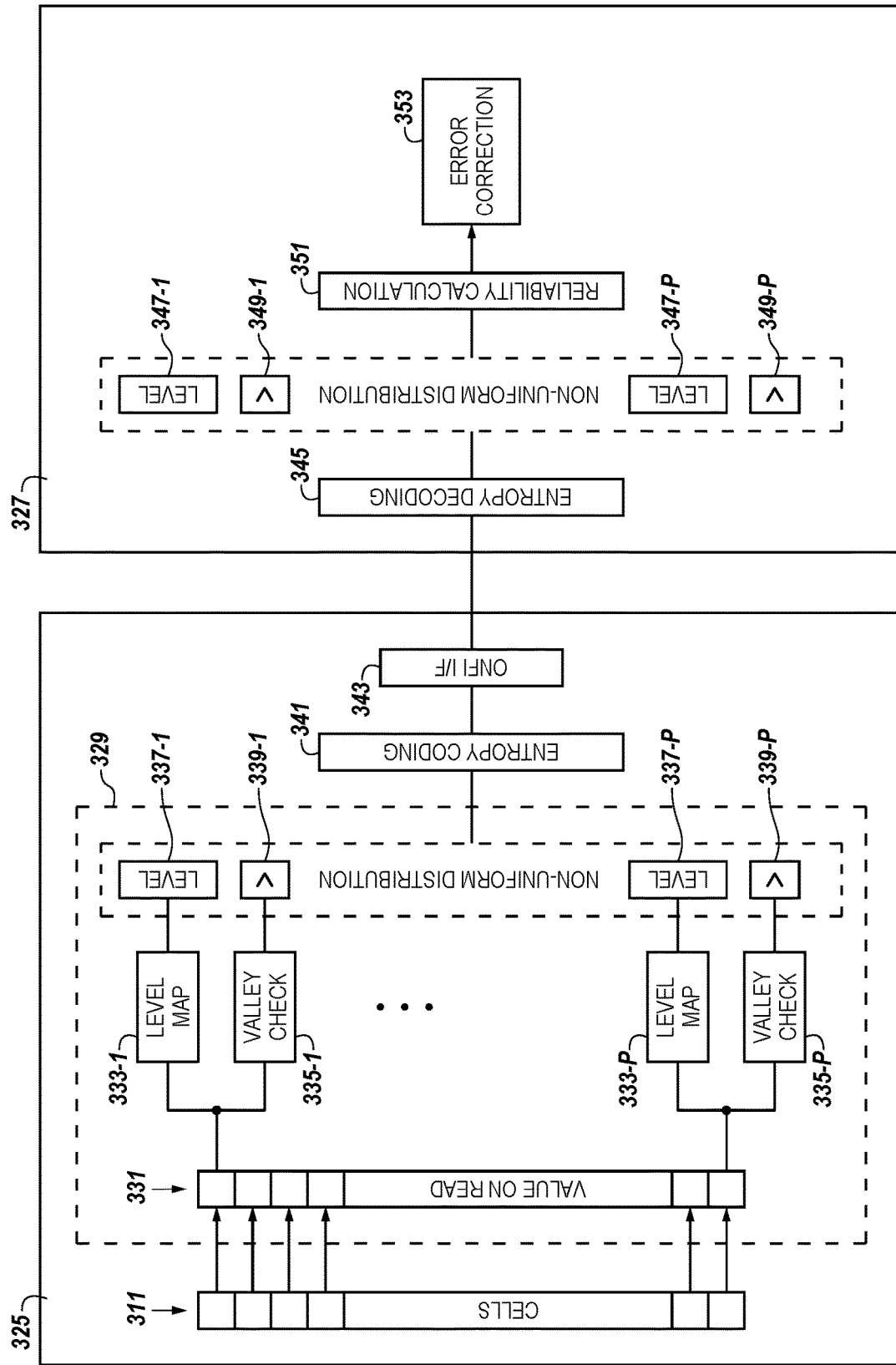
FIG. 3 illustrates a block diagram of a memory apparatus operated in accordance with a number of embodiments of the present disclosure.

FIG. 3 illustrates a block diagram of a memory apparatus operated in accordance with a number of embodiments of the present disclosure. According to some embodiments, a memory apparatus can be, for example, a memory device 325, a controller 327, or a combination of the memory device 325 and the controller 327. Although not specifically illustrated, the controller 327 can include a number of processors and/or an application specific integrated circuit (ASIC) to provide memory control functionality. The controller 327 and/or various components thereof can be on a same die as the memory device 325, can be on a different die than the memory device 325, but in a same module, or can be in a memory system, e.g., a solid state drive, which includes both the memory device 325 and the controller 327. The memory device 325 can include a number of memory cells 311 (e.g., in a memory array such as memory array 100 illustrated in FIG. 1).

The memory device 325 can include sensing circuitry 329 (e.g., to receive and decode address signals by a row decoder and/or a column decoder to access the memory array including memory cells 311). In some embodiments, the sensing circuitry can include an analog-to-digital converter (ADC). A ramping sensing signal can be output to the ADC (e.g., via a ramping sensing signal generator) and to a number of memory cells 311 (e.g., via a row decoder). In a number of embodiments, the ramping sensing signal can increase in magnitude with a linear slope from a starting magnitude to a stopping magnitude over a period of time. The starting and stopping magnitudes can be selected to encompass the range of states to which memory cells 311 in a given array can be programmed (e.g., −2V to +3V). In this manner, the ramping sensing signal can provide sensing capability for any data state of a selected memory cell with a single input. The ramping period of the signal can be selected to balance efficient sensing speeds with accurate detection of a state of the memory cell. When sufficient current flows through an associated sense line (e.g., sufficient to trip a sense amplifier) a value of the output of the ADC that receives input from the ramping sensing signal can be latched (e.g., in latches 331).

The ADC may function similarly to a counter over the period of time during which the ramping sensing signal changes. The ADC can be configured to output a value representing the state of the memory cell with a greater number of units than the number of units of data that represent the data state of the memory cell 311. For example, the ADC can be configured to output seven units (e.g., bits) for a particular memory cell 311 that is configured to store a state corresponding to three units (or another number of units). Thus, the output from the ADC can represent a more specific measurement of the state of the memory cell than is represented by the data state alone. As described herein, the three units corresponding to the data state comprise hard data, while the remaining four units can comprise soft data, for instance.

The soft data may be valuable for error correction circuitry 353 to aid in determining whether a correct data state was sensed from the memory cell 311. However, transferring seven units for every memory cell may be a significant throughput penalty versus transferring just the three units of hard data for each memory cell (in the example case of memory cells storing three units of data). Thus, according to a number of embodiments of the present disclosure, the extra units of soft data are not transferred across the interface 343. Rather, a determination can be made as to whether the state of the memory cell (e.g., as represented by the output of the ADC) is in a valley between adjacent distributions of states associated with respective data states and/or whether the state of the memory cell is within an outer portion of a distribution of states associated with a data state of the memory cell.

The ADC can be configured to output x-number of units of data (e.g., seven units of data) representing the state of the memory cell. However, the sensing circuitry 329 can be configured to output (e.g., to the entropy coding circuitry 341) fewer than x-number units of data (e.g., three units of data) representing the data state of the memory cell to the entropy coding circuitry 341. The x-number of units of data can be output from each of the latches 331 to level map circuitry 333-1, . . . , 333-P to determine a data state of the memory cell (e.g., determine to what level the memory cell was programmed). The level map circuitry 333-1, . . . , 333-P can correlate x-number units of data with a plurality of distributions of states associated with a plurality of data states.

The sensing circuitry 329 can be configured to provide the indication of whether the state of the memory cell is in the valley and/or whether the state of the memory cell is within the outer portion of the distribution of states based on the x-number units of data and the level map circuitry 333-1, . . . , 333-P. For example, the x-number units of data can also be output to valley check circuitry 335-1, . . . , 335-P to determine whether the state of the memory cell is in a valley between adjacent distributions of states associated with respective data states and/or whether the state of the memory cell is within an outer portion of a distribution of states associated with a data state of the memory cell.

In general, there may be a non-uniform distribution of memory cells having states in the valley and/or having states within an outer portion of the distribution of states. That is, most cells may have states that are well within the distribution of states such that it is clear to which data state the memory cell was programmed. For each memory cell 311, the sensing circuitry 329 can determine a data state (e.g., level 337-1, . . . , 337-P, which may comprise hard data) and indicate to the entropy coding circuitry 341 (e.g., via indication 339-1, . . . , 339-P) whether the state of the memory cell is in a valley and/or whether the state of the memory cell is within an outer portion of a distribution of states. Although not specifically illustrated, the memory device 325 can be configured to encode the data state (e.g., using a low density parity check encoding algorithm).

Entropy coding circuitry 341 can provide a lossless data compression scheme. For example, the entropy coding circuitry 341 can provide Huffman coding. An example of a compression table is provided in FIG. 4 and an example application of the coding scheme to data is provided in FIG. 5. The entropy coding circuitry 341 can make use of a compression table correlating data states with entropy encoded units of data. The compression table can include variable-length entropy encoded units of data (e.g., codes) that are derived based on an estimated probability of the occurrence of each combination of data state and whether the state is in a valley and/or within an outer portion of a distribution of states. For example, there may be an equal probability that a particular memory cell is programmed to any one of the possible data states given a sufficient amount of data. The probability that a particular memory cell has a state in a valley may be relatively low (e.g., 5%). The probability that a particular memory cell has a state in a valley may increase over the lifetime (e.g., age and/or cycles) of the memory device 325. Accordingly, the entropy coding circuitry can provide a shorter code length in response to the state of the memory cell not being in a valley and a longer code length in response to a state of the memory cell being in a valley.

The entropy coding circuitry 341 can encode the output of the sensing circuitry 329 and transmit the encoded output via an interface 343 to the controller 327. In some examples the interface 343 can be an Open NAND Flash Interface (ONFI) compliant interface. The encoded output of the sensing circuitry 329 can comprise a signal indicative of a data state of the memory cell and whether the state of the memory cell is in the valley and/or whether the state is within an outer portion of a distribution of states. In some embodiments, the length of the encoded output can provide the indication of whether the state is in the valley and/or within an outer portion of a distribution of states (e.g., as indicated by a longer code length relative to the state not being in the valley for a same data state as is described in more detail with respect to FIG. 4). A greater number of units of data output from the entropy coding circuitry 341 for a particular data state of a particular memory cell can indicate that the state of the particular memory cell is in the valley.

The controller 327 can include entropy decoding circuitry 345, which can be coupled to the interface 343 of the memory device 325. The entropy decoding circuitry can receive the output of the entropy coding circuitry 341 from the memory device 325 and decode the same. For example, the entropy decoding circuitry 345 can provide Huffman decoding. The entropy decoding circuitry 345 can determine a length of the variable-length code comprising the entropy coded data state deterministically (e.g., based on a lack of prefix repetition across the variable-length codes as illustrated and described in more detail with respect to FIG. 4). The entropy decoding circuitry 345 can decode the entropy coded data state from the variable-length code and provide an indication of whether the state is in the valley and/or within an outer portion of the distribution of states to the error correction circuitry 351 (e.g., via the reliability calculation circuitry 351). In a number of embodiments, the reliability calculation circuitry 351, itself, can provide the indication of whether the state is in the valley and/or within an outer portion of the distribution of states as described in more detail below.

The entropy decoding circuitry 345 can decode a first plurality of units of data representing a data state of a first memory cell and can decode a second plurality of units of data (different units of data) representing the same data state of a second memory cell and that a state of the memory cell is in a valley between adjacent distributions of states associated with respective data states and/or that the state is within an outer portion of the distribution of states associated with a data state of the memory cell. The first plurality of units of data indicate a state that is not in the valley and/or not within an outer portion of the distribution of states.

The entropy decoding circuitry 345 can make use of a decompression table correlating entropy encoded units of data and data states. In some embodiments, the decompression table can be the same as the compression table described herein (e.g., the compression table illustrated and described with respect to FIG. 4) but used in a reverse process with respect to compression. The decompression table can include variable-length codes that are derived based on an estimated probability of the occurrence of each combination of data state and whether the state is in a valley and/or within an outer portion of a distribution of states. By use of the decompression table, the controller 327 can determine, for each memory cell 311, a data state (e.g., level 347-1, . . . , 347-P, which may comprise hard data) and indicate to the reliability calculation circuitry 351 (e.g., via indication 349-1, . . . , 349-P) whether the state of the memory cell is in a valley and/or whether the state of the memory cell is within an outer portion of a distribution of states.

The controller 327 can include reliability calculation circuitry 351 coupled to the entropy decoding circuitry 345. For example, the reliability circuitry 351 can be log-likelihood ratio (LLR) generation circuitry. The reliability calculation circuitry 351 can generate a low confidence LLR for an error correction circuit 353 in response to transmission of units of data (e.g., from the entropy decoding circuitry 345) corresponding to the data state indicating that the state of the memory cell is in the valley and/or within an outer portion of a distribution of states. The reliability calculation circuitry 351 can generate a high confidence LLR for the error correction circuit 353 in response to transmission of units of data corresponding to the data state indicating that the state of the memory cell is not in the valley.

The controller 327 can include error correction circuitry 353 coupled to the reliability calculation circuitry 351. For example, the error correction circuitry 353 can be a low density parity check (LDPC) decoder configured to decode the data state using an LDPC decoding algorithm. The error correction circuitry 353 can be configured to perform error correction for the indicated data state (e.g., to determine if the indicated data state is correct) based on whether the state of the memory cell is in the valley and/or within an outer portion of the distribution of states. For example, the error correction circuitry 353 can be configured to use an indication that the state of the memory cell is in the valley and/or within an outer portion of the distribution of states as an input to a belief propagation algorithm.

This minimal additional information (e.g., the indication that the state of the memory cell is in the valley and/or within an outer portion of the distribution of states) can provide dramatic performance improvements for the error correction circuitry 353. For example, the error correction circuitry 353 can improve enough to correct for a raw bit error rate of $8.5 \times 10^{-3}$ versus a raw bit error rate of $3.3 \times 10^{-3}$ for a codeword failure rate of $1 \times 10^{-5}$ with an 8% ECC overhead.

Although not specifically illustrated, the controller 327 can load status information into a status register, which can further communicate status information with input/output (I/O) circuitry. Commands received by I/O circuitry can be latched by a command register and transferred to the controller 327 for generating internal signals to control memory device 325 operations. The controller 327 can be coupled to and/or internal to a host.

The controller 327 can decode signals provided by control connections from host circuitry. These signals can include chip signals, write enable signals, and address latch signals that are used to control the operations on the memory array, including data read, data write, and data erase operations, as described herein. The control connections and the I/O connections can be collectively referred to as a host interface coupling the controller 327 to the host circuitry. The controller 327 can be a state machine, a sequencer, control circuitry, or some other type of controller. It will be appreciated by those skilled in the art that additional circuitry and control signals can be provided, and that the memory device detail of FIG. 3 has been reduced to facilitate illustration.

FIG. 4 illustrates a compression table 455 correlating entropy encoded units of data and data states in accordance with a number of embodiments of the present disclosure. The compression table 455 can be analogous to a decompression table as described herein. The first column "LEVEL" represents a data state of the memory cell. The second column "NEAR VALLEY" represents whether or not the state is in the valley and/or whether the state of the memory cell is in a valley between adjacent distributions of states associated with respective data states and/or that the state is within an outer portion of the distribution of states associated with a data state of the memory cell. The third column "ENCODING" represents a plurality of entropy encoded units of data corresponding to the data state and whether the state is in the valley and/or within an outer portion of the distribution of states as indicated in the same respective row. For example, the first row includes entropy encoded units of data "[0,0,0,0]" for data state 0 and an indication (e.g., "0") that the state is not in the valley and/or within an outer portion of the distribution of states.

The compression table 455 is for memory cells that are configured to store three units of data, where each memory cell is programmed to one of eight data states (an eight-level system). The compression table includes an entry for each of 8 data states (levels 0-7) for both instances where the state of the memory cell is in a valley and/or within an outer portion of the distribution of states (1) and instances where the state is not in the valley and/or within an outer portion of the distribution of states (0). The entropy encoding for the data states includes fewer units of data when the state is not in the valley and/or within an outer portion of the distribution of states and more entropy encoded units of data when the state is in the valley and/or within an outer portion of the distribution of states.

The entropy encoded units of data "[0,0,0]" are not used for any of the eight entropy encoded units of data associated with states not in the valley because "0,0,0" is the prefix for those entropy encoded units of data indicating that the state is in the valley and/or within an outer portion of the distribution of states (e.g., "0,0,0" is the prefix for "[0,0,0,1,1,0,1]" which are the entropy encoded units of data for "level 0" when the state is in the valley). Thus, the entropy encoded units of data for "level 0" when the state is not in the valley is "[0,0,0,0]". Such a constraint can aid the entropy decoding circuitry (e.g., entropy decoding circuitry 345 illustrated in FIG. 3) in determining a length of the variable-length code comprising the entropy coded data state deterministically (e.g., based on a lack of prefix repetition across the variable-length entropy encoded units of data). The specific entropy encoded units of data listed in the compression table 455 are examples and other codes or combinations of entropy encoded units of data can be used, as will be appreciated by one of ordinary skill in the art.

The entropy encoded units of data illustrated in the compression table 455 can be transmitted by the entropy coding circuitry and can represent both the data state and whether the state of the memory cell is in the valley and/or within an outer portion of the distribution of states. In a number of embodiments, the entropy coding circuitry can transmit a minimum number of units of data necessary to indicate the data state of the memory cell and to indicate that the state of the memory cell is not in the valley and/or within an outer portion of the distribution of states. For example, with respect to the compression table 455, a minimum number of units of data to indicate a data state of a three-unit memory cell is three units of data. And, only three units of data are sufficient to indicate the data state of the memory cell and to indicate that the state of the memory cell is not in the valley and/or within an outer portion of the distribution of states for data states 1-7 in this example.

For a particular data state (e.g., data state "LEVEL 1") a first plurality of entropy encoded units of data (e.g., "[0,0, 0,1,1,0,0]") can be transmitted corresponding to the data state in response to the state being in the valley and/or within an outer portion of the distribution of states (e.g., "1"). For the same particular data state (e.g., data state "LEVEL 1") a second plurality of entropy encoded units of data (e.g., "[0,1,1]") can be transmitted corresponding to the data state in response to the state not being in the valley and/or within an outer portion of the distribution of states (e.g., "0").

According to the compression table 455, the plurality of entropy encoded data units associated with the state being in the valley and/or within an outer portion of the distribution of states (e.g., "1") is greater (e.g., by at least two data units, for example, more than a single flag bit) than the plurality of entropy encoded data units associated with the state not being in the valley and/or within an outer portion of the distribution of states (e.g., "0"). Both the first and the second plurality of units of data can correspond to the same data state (e.g., "LEVEL 1").

Although such a scheme may include at least two more units of data to indicate that the state is in the valley and/or within an outer portion of the distribution of states, overall, such a scheme can provide greater throughput at an interface. Unlike a single flag bit, which would be required for indication with each memory cell, the longer entropy encoded data units according to the present scheme are only used when a particular memory cell stores a state that is in the valley and/or within an outer portion of the distribution of states, which, as described herein, occurs relatively infrequently. For example, with respect to a memory device employing three-units per memory cell, a flag bit would impose a 33% throughput penalty. In contrast, a number of embodiments of the present disclosure can achieve the same result with only a 9.5% throughput penalty assuming that 5% of the cells store states that are in the valley and/or within an outer portion of the distribution of states.

Figure 5:
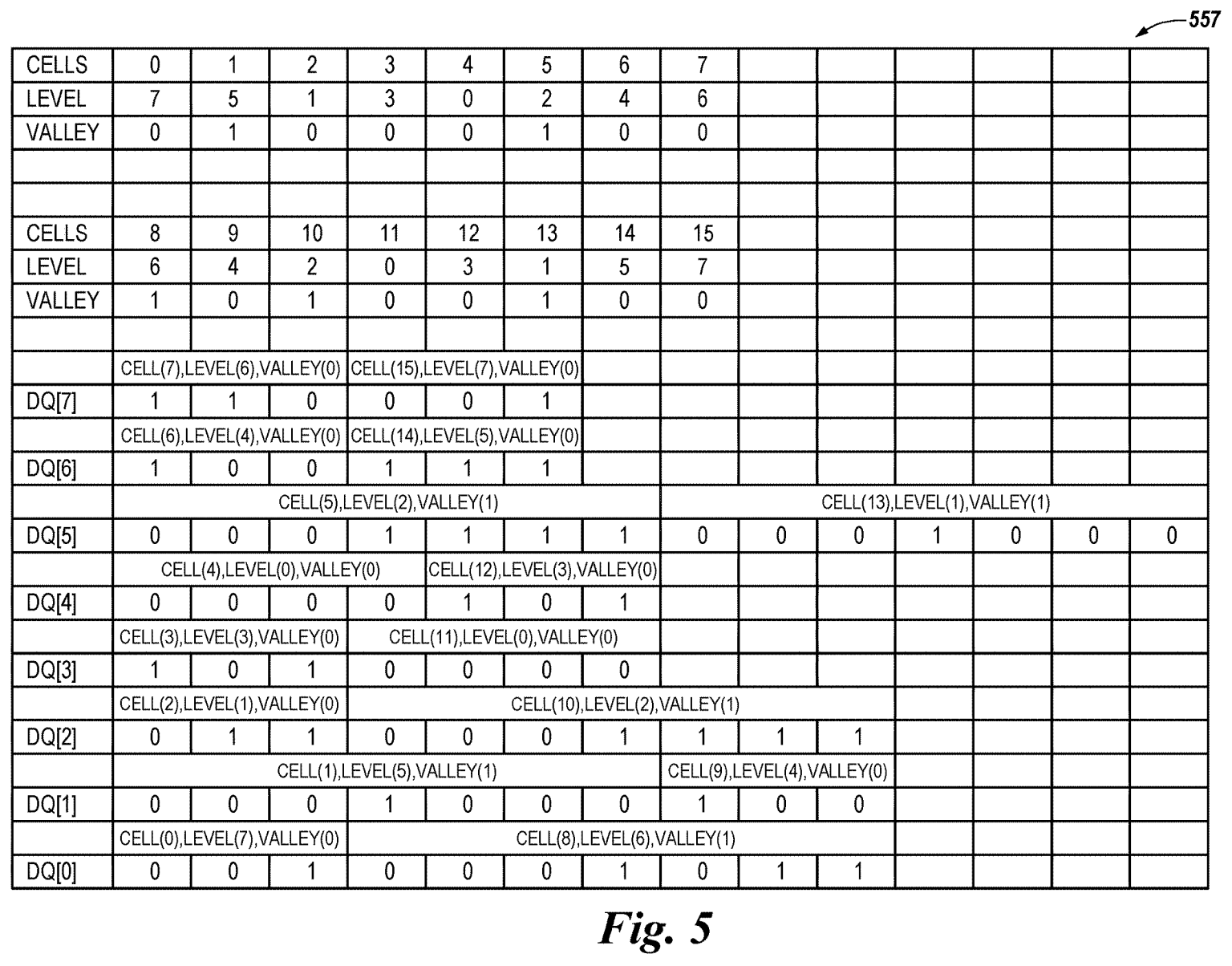

FIG. 5 illustrates a tabular representation 557 of transmissions of various entropy encoded units of data corresponding to various data states and whether states stored on various memory cells are in a valley and/or within an outer portion of the distribution of states in accordance with a number of embodiments of the present disclosure. The top portion of the tabular representation 557 includes data states (e.g., "LEVEL") and an indication of whether (0=no; 1=yes) the state of each memory cell is in the valley and/or within the outer portion of the distribution of states for memory cells numbered 0-15. The bottom portion of the tabular representation 557 includes DQ strobes numbered 0-7 showing how the entropy encoded units of data are transmitted for each of the sixteen cells across the eight-unit wide bus. Cross-reference to FIG. 4 shows the entropy encoded units of data associated with each data state indicated in the tabular representation 557. For example, "CELL 0" has an indication for "LEVEL 7" and "VALLEY 0", which, with cross-reference to FIG. 4 is associated with entropy encoded units of data "[0,0,1]". Therefore, looking at "DQ[0]" for "CELL(0)" the entropy encoded units of data "0_0_1" are illustrated as the first three units of data transmitted by "DQ[0]". As will be appreciated, similar cross-reference can be made for each of the memory cells, data states, and "valley" indications presented in the tabular representation 557.

Although more than 5% of the memory cells are indicated to store a state in a valley and/or within an outer portion of the distribution of states in FIG. 5, this is done for illustrative purposes rather than to indicate an actual sample of data from a memory device. The tabular representation 557 illustrates that different numbers of entropy encoded units of data can be transmitted to indicate a same data state depending on whether the state of a particular memory cell is indicated to be in a valley and/or within an outer portion of the distribution of states as described herein. Furthermore, both transmission and reception of the different numbers of entropy encoded units of data can occur without additional indication of how many entropy encoded units of data a particular transmission includes due to the nature of the entropy encoding scheme as described herein.

Figure 6:
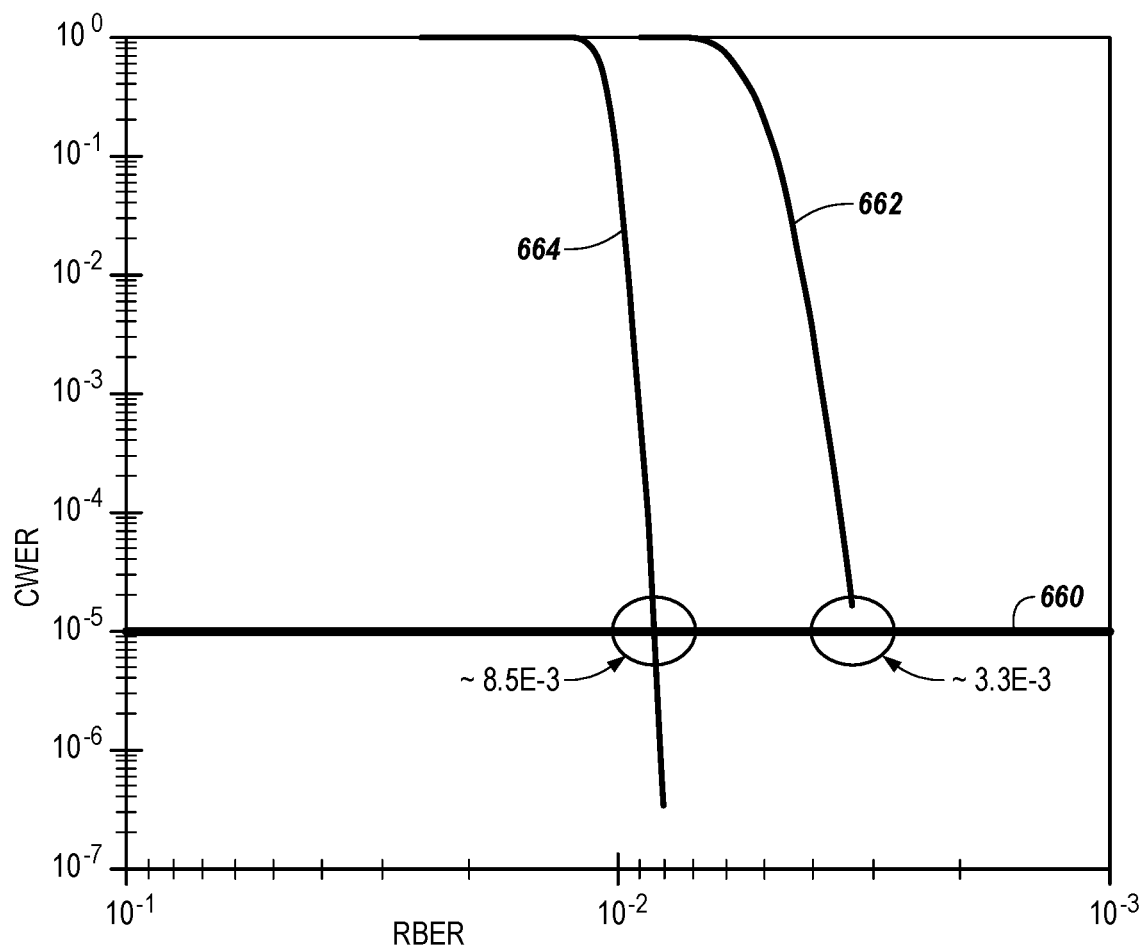
FIG. 6 is a plot illustrating codeword error rate (CWER) versus raw bit error rate (RBER) according to various approaches including at least one in accordance with a number of embodiments of the present disclosure.

FIG. 6 is a plot illustrating codeword error rate (CWER) versus raw bit error rate (RBER) according to various approaches including at least one in accordance with a number of embodiments of the present disclosure. The hash marks on the CWER and RBER axes indicate that the plot is a log-log plot (using a logarithmic scale). This plot is comparing the codeword failure rate of hard reads with hard inputs (e.g., first curve 662 according to some previous approaches) to the ECC versus having an indication that the state of the memory cell is in the valley and/or within an outer portion of the distribution of states (e.g., via one soft read as illustrated at second curve 664 according to a number of embodiments of the present disclosure). The first curve 662 is the codeword failure rate with hard reads/hard inputs to the ECC. The second curve 664 is the codeword failure rate with an indication that the state of the memory cell is in the valley and/or within an outer portion of the distribution of states. The horizontal line 660 is the $1 \times 10^{-5}$ codeword error rate. Hard reads can support a codeword failure rate of $1 \times 10^{-5}$ with an RBER of $3.3 \times 10^{-3}$, whereas with an indication that the state of the memory cell is in the valley and/or within an outer portion of the distribution of states an RBER of $8.5 \times 10^{-3}$ can be supported.

CONCLUSION

The present disclosure includes apparatuses and methods related to memory cell state in a valley between adjacent data states. A number of methods can include determining whether a state of a memory cell is in a valley between adjacent distributions of states associated with respective data states. The method can include transmitting a signal indicative of a data state of the memory cell and whether the state of the memory cell is in the valley.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells; and
sensing circuitry coupled to the array, wherein the sensing circuitry includes a ramping sensing signal generator coupled to an analog-to-digital converter (ADC) and wherein the sensing circuitry is configured to:
sense a memory cell; and
provide an indication when a state of the memory cell is within an outer portion of a distribution of states associated with a data state of the memory cell;
wherein the ADC is configured to output x-number units of data representing the state of the memory cell;
wherein the sensing circuitry is configured to transmit fewer than x-number units of data representing the data state of the memory cell to the entropy coding circuitry;
entropy coding circuitry coupled to the sensing circuitry, wherein the entropy coding circuitry is configured to:
transmit a first plurality of entropy encoded units of data representing the data state of the memory cell in response to the indication that the state is within the outer portion of the distribution; and
transmit a second plurality of entropy encoded units of data representing the data state of the memory cell in response to the indication that the state is within an inner portion of the distribution; and
level map circuitry that correlates x-number units of data to a plurality of distributions of states associated with a plurality of data states.

2. The apparatus of claim 1, wherein the sensing circuitry is configured to transmit an indication of whether the state of the memory cell is within the outer portion of the distribution to the entropy coding circuitry.

3. The apparatus of claim 1, wherein the sensing circuitry is configured to provide the indication of whether the state of the memory cell is within the outer portion of the distribution of states associated with the data state of the memory cell based on the x-number units of data and the correlation provided by the level map circuitry.

4. The apparatus of claim 1, wherein the sensing circuitry is configured to sense the memory cell using a plurality of discrete sensing signals.

5. The apparatus of claim 1, wherein the apparatus further comprises an Open NAND Flash Interface (ONFI) compliant interface coupled to the entropy coding circuitry to which the entropy coding circuitry transmits the first or the second plurality of entropy encoded units of data.

6. The apparatus of claim 1, wherein the apparatus stores a compression table correlating the data state with the first and the second plurality of entropy encoded units of data.

7. An apparatus, comprising:
entropy decoding circuitry configured to:
decode a first plurality of units of data representing a data state of a first memory cell;
decode a second plurality of units of data representing the data state of a second memory cell, wherein the second plurality of units of data comprise a greater number of units of data than the first plurality of units of data;
transmit a first indication of the data state of the first memory cell and that the state of the first memory cell is not in a valley between adjacent distributions of states associated with respective data states; and
transmit a second indication of the data state of the second memory cell and that the state of the second memory cell is in the valley; and
reliability calculation circuitry coupled to the entropy decoding circuitry, wherein the reliability calculation circuitry is configured to receive the first and the second indications from the entropy decoding circuitry.

8. The apparatus of claim 7, wherein the entropy decoding circuitry is further configured to receive the first and the second plurality of units of data from an interface, wherein the first and the second plurality of units of data comprise entropy encoded units of data; and
wherein the apparatus stores a decompression table correlating the first and the second plurality of entropy encoded units of data with the data state.

9. The apparatus of claim 7, wherein the reliability calculation circuitry is configured to transmit a low confidence signal in response to the second indication that the state of the second memory cell is in the valley.

10. The apparatus of claim 9, wherein the apparatus further includes error correction circuitry coupled to the reliability calculation circuitry, wherein the error correction circuitry is configured to use the second indication that the state of the second memory cell is in the valley as an input to a belief propagation algorithm.

11. The apparatus of claim 10, wherein the error correction circuitry comprises a low density parity check decoder.

12. The apparatus of claim 7, wherein the reliability calculation circuitry is configured to generate a high confidence signal in response to the first indication that the state of the first memory cell is not in the valley.

13. The apparatus of claim 7, wherein the reliability calculation circuitry comprises log-likelihood ratio generation circuitry.

14. An apparatus, comprising:
a memory device including:
sensing circuitry coupled to an array of memory cells, wherein the sensing circuitry is configured to determine whether a state of a memory cell of the array is in a valley between adjacent distributions of states associated with respective data states; and
entropy coding circuitry coupled to the sensing circuitry, wherein the entropy coding circuitry is configured to entropy code the data state as a variable-length code indicating a data state of the memory cell and whether the state of the memory cell is in the valley;
wherein the memory device is configured to encode the data state using a low density parity check (LDPC) encoding algorithm; and
a controller coupled to the memory device, the controller including:
entropy decoding circuitry configured to decode the data state from the variable-length code; and
error correction circuitry, comprising an LDPC decoder configured to:
decode the data state using an LDPC decoding algorithm; and
perform error correction for the data state based on whether the state of the memory cell is in the valley.

15. The apparatus of claim 14, wherein the entropy coding circuitry is configured to entropy code the data state as the variable-length code having a shorter code length in response to the state not being in the valley and having a longer code length in response to the state being in the valley.

16. The apparatus of claim 14, wherein the entropy coding circuitry is configured to:

transmit a first plurality of units of data representing a data state of the memory cell in response to the state of the memory cell being in a valley; and transmit a second plurality of units of data representing the data state of the memory cell in response to the state of the memory cell not being in a valley, wherein the second plurality of units of data includes more units of data than the first plurality of units of data.

\* \* \* \* \*